(12) United States Patent
Fushimi et al.

(10) Patent No.: US 7,050,103 B2
(45) Date of Patent: May 23, 2006

(54) IMAGE PICKUP DEVICE AND COVER PLATE WITH CONDUCTIVE FILM LAYER

(75) Inventors: Masahiro Fushimi, Tokyo (JP); Yoshiaki Nomura, Saitama (JP); Makoto Mogamiya, Tokyo (JP)

(73) Assignee: PENTAX Corporation, Tokyo (JP)

( * ) Notice: Subject to any disclaimer, the term of this patent is extended or adjusted under 35 U.S.C. 154(b) by 768 days.

(21) Appl. No.: 09/859,396

(22) Filed: May 18, 2001

(65) Prior Publication Data

US 2002/0012062 A1 Jan. 31, 2002

(30) Foreign Application Priority Data

May 29, 2000 (JP) .......................... P2000-157900

(51) Int. Cl.
*H04N 5/225* (2006.01)
(52) U.S. Cl. ...................... 348/340; 348/342; 348/374
(58) Field of Classification Search ................ 348/342, 348/340, 374, 75; 257/678, 666, 644
See application file for complete search history.

(56) References Cited

U.S. PATENT DOCUMENTS

| | | | |
|---|---|---|---|
| 4,761,682 A * | 8/1988 | Asaida ........................ 348/265 |
| 5,616,949 A * | 4/1997 | Watanabe .................... 257/434 |
| 5,648,653 A * | 7/1997 | Sakamoto et al. ........ 250/208.1 |
| 5,786,589 A * | 7/1998 | Segawa et al. .......... 250/208.1 |
| 5,870,638 A | 2/1999 | Kurosawa |
| 5,893,653 A | 4/1999 | Abe |
| 6,035,147 A | 3/2000 | Kurosawa |
| 6,069,651 A * | 5/2000 | Tsuyuki et al. ................ 348/75 |
| 6,191,411 B1 * | 2/2001 | Kaifu ...................... 250/214 R |
| 6,476,469 B1 * | 11/2002 | Hung et al. .................. 257/676 |
| 6,650,474 B1 * | 11/2003 | Osawa ........................ 359/495 |
| 2001/0007475 A1 * | 7/2001 | Mogamiya ................... 348/374 |

FOREIGN PATENT DOCUMENTS

JP 11282047 10/1999

* cited by examiner

*Primary Examiner*—David L. Ometz
*Assistant Examiner*—Gevell Selby
(74) *Attorney, Agent, or Firm*—Greenblum & Bernstein, P.L.C.

(57) ABSTRACT

A cover plate for covering an opening of a casing in which a solid state imaging device is disposed. The cover plate comprises a transparent cover plate member and a conductive film layer. The cover plate hermetically covers the opening of the casing and the conductive film layer covers the outermost surface of the transparent cover plate member. The transparent cover plate member is comprised of a plurality of laminated transparent plates such as lithium niobate plates for an optical low-pass filter and a plate for an infrared cut-off filter. An example of the conductive film layer is a metallic film such as Cr or Au, coated on the surface.

13 Claims, 7 Drawing Sheets

FIG. 7

| | CONDITION OF DEPOSITION | | | | PROPERTY OF FILM | | | |
|---|---|---|---|---|---|---|---|---|
| | VACUUM INTENSITY | TEMPERATURE OF LN PLATE | SPEED OF DEPOSITION | THICKNESS | FILM RESISTANCE | STATIC POTENTIAL | | |
| | | | | | | BEFORE COATING | AFTER COATING | |
| EXAMPLE 1 | 2.0×10⁻⁵torr | 100°C | 20nm/nin | 1.7nm | 870kΩ | ABOUT 0.5kV | ABOUT 0.1kV |
| EXAMPLE 2 | 2.0×10⁻⁵torr | 100°C | 3.3nm/nin | 3.3nm | ABOVE 40kΩ | ABOUT 0.5kV | ABOUT 1.0kV |

IMAGE PICKUP DEVICE AND COVER PLATE WITH CONDUCTIVE FILM LAYER

BACKGROUND OF THE INVENTION

1. Field of the Invention

The present invention relates to a transparent cover plate that shields a solid state imaging device of an image pickup device mounted in, for example, a digital still camera or digital video camera.

2. Description of the Related Art

Conventionally, in the art of digital still or video cameras, an optical low-pass filter or an infrared cut-off filter is interposed between a taking lens and an image pickup device to improve the quality of images taken by the cameras. The optical low-pass filter is used to suppress moiré fringes caused by beats or interference between a periodic pattern of an object and a pitch of pixels, in the image pickup device. The infrared cut-off filter prevents adverse effects of infrared rays to a captured image. However, the conventional structure for mounting the optical low-pass filter or infrared cut-off filter requires a comparatively large space between the taking lens and the image pickup device. Accordingly, conventional structures limit design flexibility along the optical axis between the taking lens and the image pickup device.

The foregoing problem may be settled by disposing the optical low-pass filter or infrared cut-off filter as close to the image pickup device as possible. However, when the optical low-pass filter or infrared cut-off filter is disposed closer to the image pickup device, an unfavorable effect to the quality of the taking images, caused by dust on the filters, increases. Further, the conventional optical low-pass filter, infrared cut-off filter and cover glass are insulators, thus they attract dust in the air by electrostatic attraction. Particularly, when lithium niobate ($LiNbO_3$) is utilized as an optical low-pass filter, as disclosed in Japanese Unexamined Patent Publication No. 11-282047, the filter attracts a considerable amount of dust since lithium niobate has strong pyroelectricity characteristics.

SUMMARY OF THE INVENTION

Therefore, an object of the present invention is to provide a transparent cover plate for a solid state imaging device which is able to prevent dust collecting on the surface of the cover plate. Further, an object of the present invention is to provide an image pickup device that utilizes the above transparent cover plate.

According to the present invention, a cover plate comprising a transparent cover plate member and conductive film layer is provided to cover an opening of a casing in which a solid state imaging device is disposed. The transparent cover plate member hermetically covers the opening and the outermost surface of the transparent cover plate member is covered with a conductive film layer.

Further, according to the present invention, an image pickup device is provided that comprises a solid state imaging device, a casing, a transparent cover plate member and a conductive film layer. The solid state imaging device is disposed in the casing, and the transparent cover plate member hermetically covers an opening of the casing. The conductive film layer covers the outermost surface of the transparent cover plate member.

BRIEF DESCRIPTION OF THE DRAWINGS

The objects and advantages of the present invention will be better understood from the following description, with reference to the accompanying drawings in which:

FIG. 7 is a table that shows deposit conditions and properties of a film in examples 1 and 2;

DESCRIPTION OF THE PREFERRED EMBODIMENTS

Figure 1:
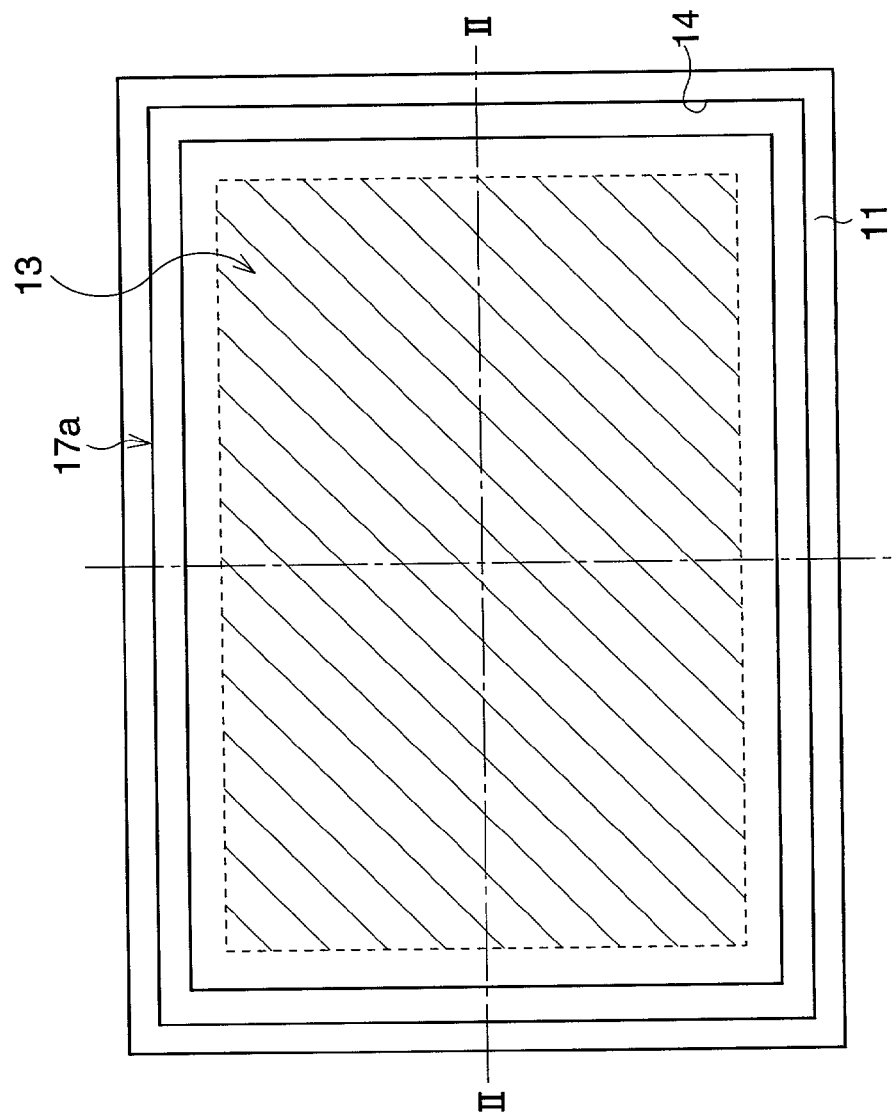
FIG. 1 is a front view showing an image pickup device to which a first embodiment of the present invention is applied.

The present invention is described below with reference to embodiments shown in the drawings.

Figure 2:
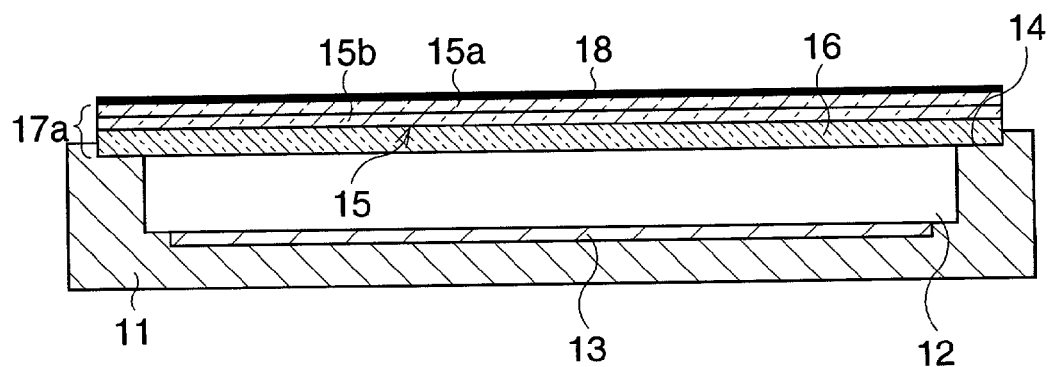
FIG. 2 is a sectional view on line II—II in FIG. 1, showing the image pickup device of the embodiment.

FIG. 1 and FIG. 2 show a plane view and sectional view of the image pickup device with a transparent cover plate member to which an embodiment of the present invention is applied. Note that FIG. 2 is a cross section along the line II—II of FIG. 1.

A casing 11 is made in a shape of a flat ceramic box and a rectangular recessed portion 12 is formed inside the casing 11. A solid state imaging device 13 is placed on the base of the recessed portion 12. In FIG. 1, the solid state imaging device 13 is indicated as a hatched portion depicted within a phantom line. On the inner periphery of the recessed portion 12, a step 14 is formed. Instead of a conventional cover glass, a transparent cover plate member 17a is fitted into the step 14 to cover and shield the solid state imaging device 13. The transparent cover plate member 17a is a laminate rectangular plate comprised of an optical low-pass filter 15 and infrared cut-off filter 16. The transparent cover plate member 17a is mounted to the casing 11 so that the infrared cut-off filter 16 is arranged inside the casing 11. The optical low-pass filter 15 is comprised of two lithium niobate (LN) plates 15a and 15b, by way of example, which are adhered together and integrated. On the outer surface of the lithium niobate plate 15a, which is arranged on the side opposite to the surface to which the infrared cut-off filter 15 is adhered, a conductive film (layer) 18 is coated. For example, the conductive film 18 is a thin metallic film layer of Cr or Au, etc. Namely, the conductive film 18 is formed on the outer surface of the outermost member from the solid state imaging device 13 of the transparent cover plate member 17a. The edges of the transparent cover plate member 17a are adhered to the step 14 by a bonding agent. The recessed portion 12 is filled with an inert gas, i.e. nitrogen gas, and is enclosed by the transparent cover plate member 17a. Namely, the transparent cover plate member 17a hermetically seals the casing 11 and shields the solid state imaging device 13 from the open air. Note that, deposition of the thin coating of conductive material on the optical low-pass filter 15 is carried out by a vacuum metal deposition process or cathode sputtering process, for example. In this embodiment, the optical low-pass filter 15 is comprised of two lithium niobate plates, however, it may comprise a plurality of crystal or lithium niobate plates.

According to the first embodiment of the present invention, as an alternative to a conventional cover glass, the transparent cover plate member, which is comprised of a laminated optical low-pass filter and infrared cut-off filter, is used to cover the solid state imaging device. Therefore, there is no need to provide a conventional mounting structure for an optical low-pass filter and infrared cut-off filter, and the available space is increased between the taking lens and the solid state imaging device. Consequently, this allows various design options along the optical axis between the taking lens and the image pickup device 13 and also simplifies the structure of the optical system utilized in the image pickup device. Further, since the outer surface of the transparent cover plate member is coated with the conductive film, an electrical charge in the laminated plate of the transparent cover plate member, i.e. the LN plate, is prevented, even though the pyroelectricity characteristic of the plate is induced by temperature variance or other surrounding conditions. Therefore adsorption of dust is prevented and the image quality of the solid state imaging device improves. Furthermore, since the infrared cut-off filter is hermetically sheltered from the open air by the optical low-pass filter, the quality of the infrared cut-off filter 20, which has moisture absorbent properties, is protected from humidity induced deterioration.

Figure 3:
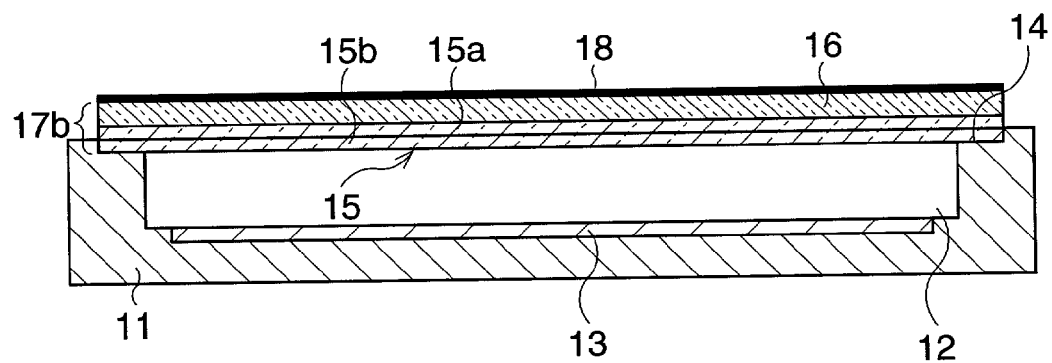
FIG. 3 illustrates a sectional view of an image pickup device to which a second embodiment of the present invention is applied.

A second embodiment of the present invention is explained with reference to FIG. 3.

In the second embodiment, the arrangement of the optical low-pass filter 15 and the infrared cut-off filter 16 in the first embodiment is changed. Namely, the transparent cover plate member 17b is mounted on the casing 11, so that the infrared cut-off filter 16 forms the outer side of the transparent cover plate member 17b and the optical low-pass filter 15 forms the inner side of the transparent cover plate member 17b. The conductive film 18 is formed on the outer surface of the infrared cut-off filter 16. Other structure of the second embodiment is the same as the first embodiment. Consequently, according to the second embodiment, a similar effect as in the first embodiment is obtained.

Figure 4:
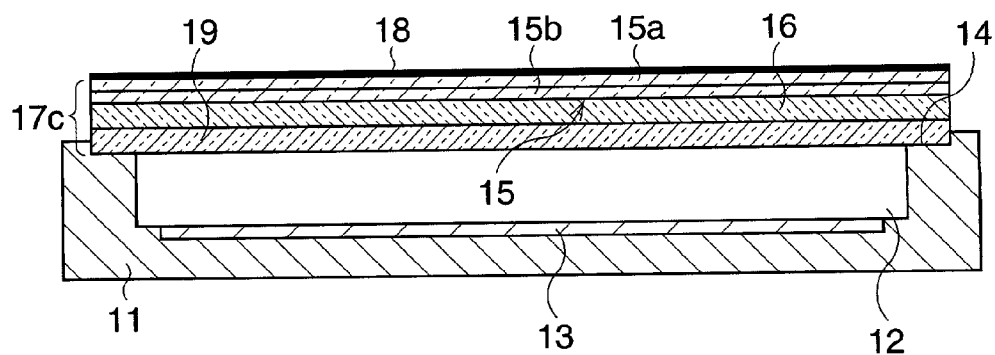
FIG. 4 illustrates a sectional view of an image pickup device to which a third embodiment of the present invention is applied.
Figure 5:
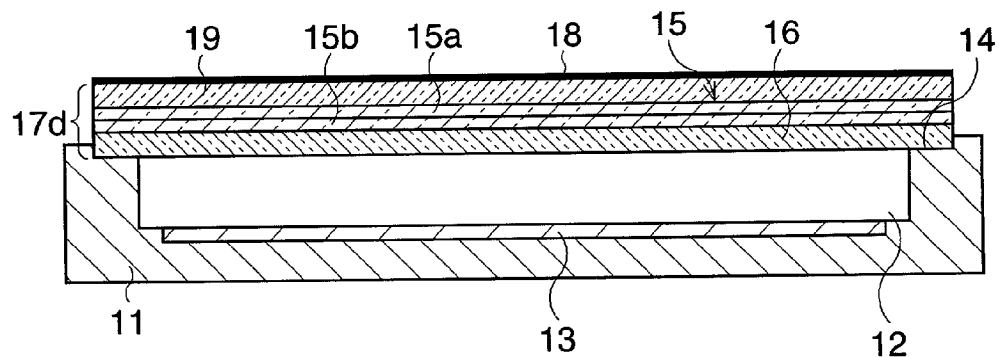
FIG. 5 illustrates a sectional view of an image pickup device to which a fourth embodiment of the present invention is applied.
Figure 6:
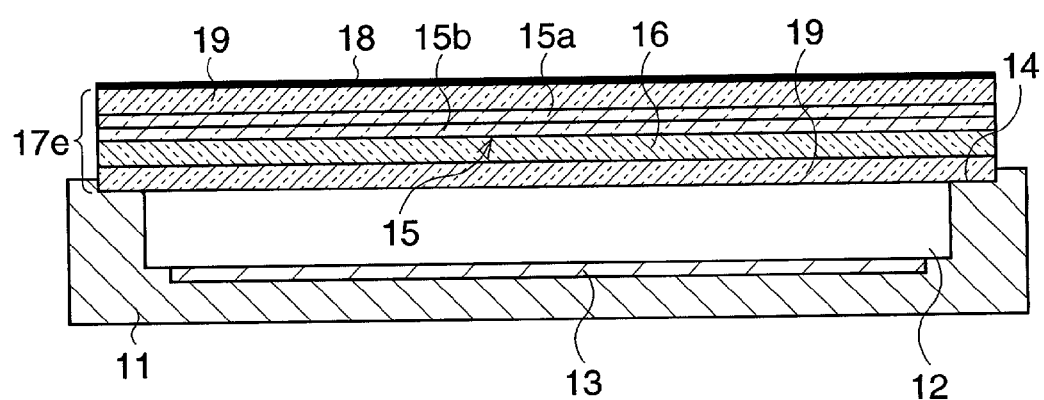
FIG. 6 illustrates a sectional view of an image pickup device to which a fifth embodiment of the present invention is applied.

With reference to FIG. 4 to FIG. 6, third to fifth embodiments of the present invention are explained. Note that, FIG. 4 to FIG. 6 respectively illustrate a cross section of the third to fifth embodiment.

Transparent cover plate members 17c, 17d and 17e utilized in the third, fourth and fifth embodiments are laminates of an optical low-pass filter, infrared cut-off filter and cover glass. Namely, in the third embodiment, the optical low-pass filter 15, which is comprised of LN plates, the infrared cut-off filter 16 and a cover glass 19 are laminated in this order, from the outer side and form a transparent cover plate member 17c that is attached to the casing 11. The outermost surface of the optical low-pass filter 15 is covered with a conductive film 18, comprised of Cr, Au, etc. In the fourth embodiment, a transparent cover plate member 17d is a laminate of the cover glass 19, optical low-pass filter 15 and infrared cut-off filter 16 in that order, from the outer side, and the conductive film 18 is deposited on the outside surface of the cover glass 19.

In the fifth embodiment, in addition to the third and fourth embodiments, one more cover glass 19 is applied to a transparent cover plate member 17e. Namely, the transparent cover plate member 17e in the fifth embodiment is comprised of the cover glass 19, optical low-pass filter 15, infrared cut-off filter 16 and cover glass 19, which are laminated in that order, from the outer side, and on the outside surface of the cover glass 19 disposed at the outermost position, the conductive film 18 is deposited.

As described above, according to the third, fourth and fifth embodiment, a similar effect as the first and second embodiment is obtained.

Note that, the form and measurements of the optical low-pass filter and the distance between the low-pass filter and the solid state imaging device can be altered as required. In the above embodiments, examples of the conductive film were Cr and Au, however, it can be replaced by other metals, for example, Al, Cu, Ni, Mg or Pt. The conductive film can be also replaced by ITO (Indium-Tin-Oxide), which may be applied as a transparent electrode. For ITO, vacuum metal deposition, cathode sputtering, dip or spin coat process, etc., may be applied to form the conductive film on the surface of the transparent cover plate member. Further, the order of laminate members, such as infrared or optical low-pass filters and cover glasses, is not restricted to the above embodiments and may be altered as required.

Figure 8:
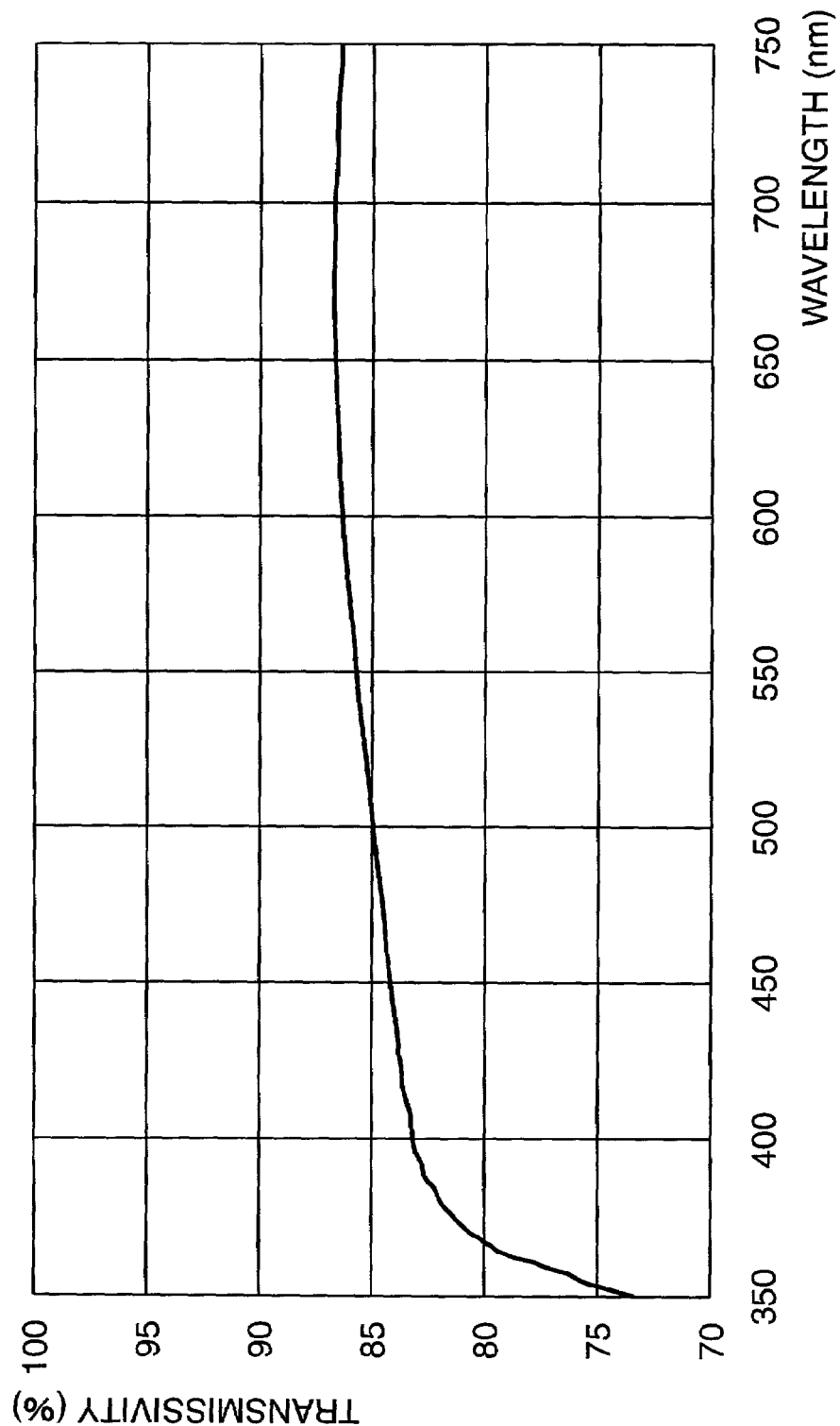
FIG. 8 is a graph that shows a spectral property of transmittance of a conductive film in example 1.
Figure 9:
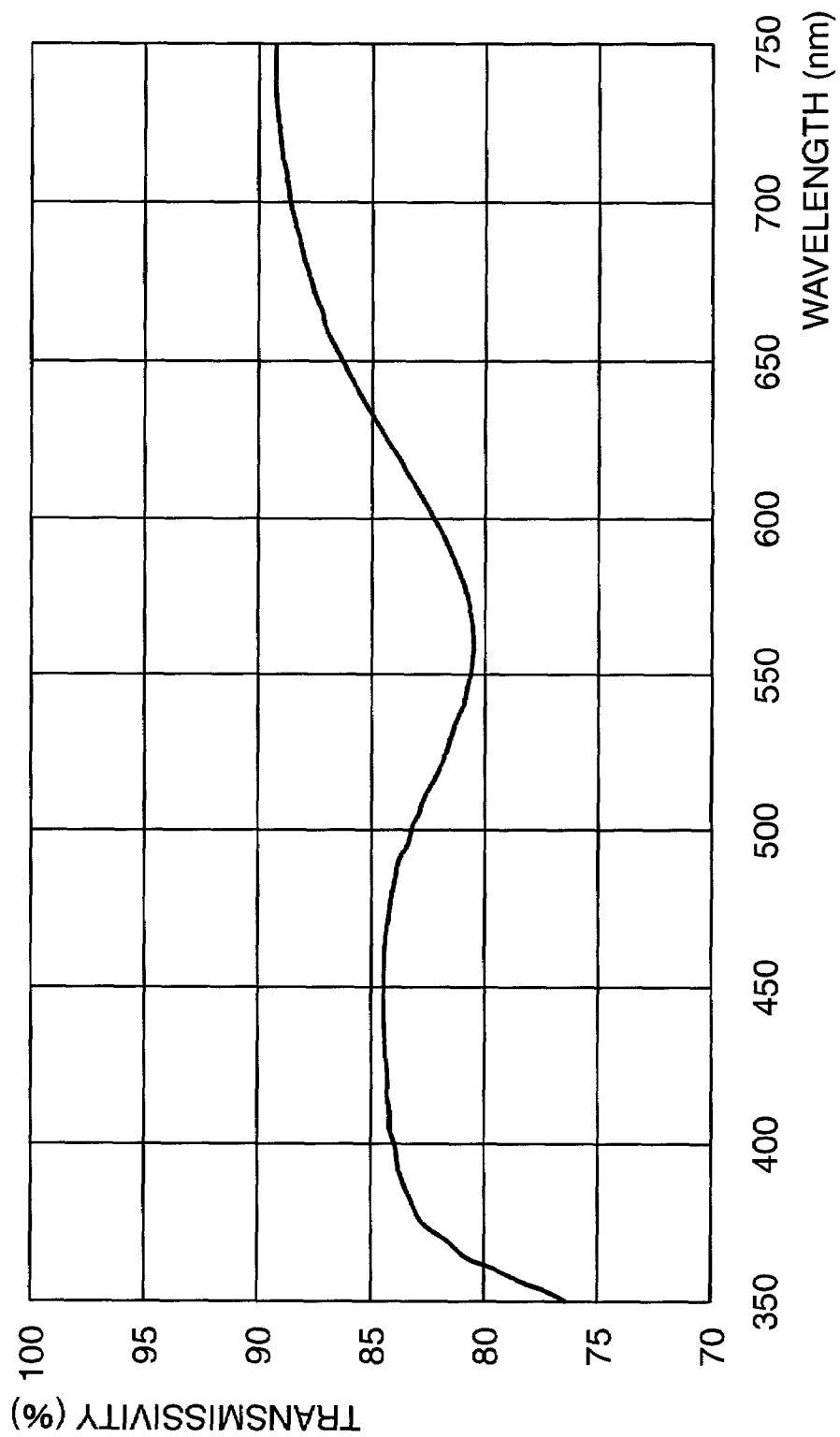
FIG. 9 is a graph that shows a spectral property of transmittance of a conductive film in example 2.

FIGS. 7–9 show examples of dust eliminating effects of the Cr and Au conductive films and their properties, such as film resistance, surface potential and spectral properties. FIG. 7 is a table that shows deposit conditions and film properties in examples 1 and 2. FIG. 8 and FIG. 9 respectively indicate spectral properties of transmissivity of the conductive films in examples 1 and 2. In each example 1 and 2, the conductive film is created on the LN plate by the vacuum metal deposition process.

EXAMPLE 1

Example 1 relates to a Cr conductive film. The deposit conditions for the Cr conductive film are shown in the table of FIG. 7. Namely, the deposition of the Cr conductive film was carried out under the following conditions: vacuum intensity at $2.0 \times 10^{-5}$ torr, temperature of the LN plate at 100° C. and speed of the deposition at 20 nm/min. The thickness of the Cr conductive film was 1.7 nm. With above conditions, the film resistance between 1 cm distant electrodes was 870 kΩ. Surface potential of the LN plate before the Cr coating was about 0.5 kV and after the Cr coating was about 0.1 V. Hence the amount of surface potential of the LN plate was reduced by about three digits by the deposition of the Cr film. Note that, the surface potential was remotely measured by the DIGITAL STATIC METER MODEL 204 of Hugle Electronics Inc. To observe the effect of the Cr film coating, dust was sprinkled on a sample of the above Cr film coated LN plate, and a dust removal test was made with a blower. As a result, dust 10 μm in size, or above, was removed by the blower.

It was also considered that, when a cover plate of the solid state imaging device is coated with a metallic film, transmissivity of the cover plate may decline, so that sensitivity of the image pickup device may decrease. FIG. 8 is a graph of the transmissivity of the LN plate with the above Cr film, and the abscissa indicates wavelengths of light. As shown in the graph, a loss of transmissivity by the conductive film of example 1, in the visible rays, is about 15 percent. However, with the solid state imaging device, which detects image signals by electrical signals, this loss can be easily restored by gain control of an amplifier or by image processing software on a computer system. Note that, since the deposited film is stable, a Cr conductive film shows high durability, as well as high conductivity. Therefore, it can provide prevention effect of electrification and durability even though the film is thin. As a result it is possible to increase the transmissivity of the cover plate.

EXAMPLE 2

Example 2 relates to an Au conductive film. In example 2, the conductive film is deposited under the following conditions: vacuum intensity at $2.0\times10^{-5}$ torr, temperature of the LN plate at 100° C. and speed of the deposition at 3.3 nm/min. The thickness of the Au conductive film was 3.3 nm. With the above conditions, the film resistance between 1 cm distant electrodes was above 40 MΩ. Surface potential of the LN plate before the Au coating was about 0.5 kV and after the Au coating was about 1.0 V. Namely, the surface potential of the LN plate was reduced about two digits by the deposition of the Au film coating. Further, in the same way as in example 1, to observe the effect of the Au film coating, dust was sprinkled on a sample of the Au film coated LN plate and a dust removal test was made with a blower. As a result, dust 10 µm in size or above was removed by the blower.

FIG. 9 is a graph of the transmissivity of the LN plate with the Au film, and the abscissa indicates wavelengths of light. As shown in the graph, the spectrum of transmittance by the Au conductive film is slightly inferior to the Cr conductive film of the example 1. However, as in example 1, a loss of transmissivity in visible rays averages about 15 percent.

Although the embodiments of the present invention have been described herein with reference to the accompanying drawings, obviously many modifications and changes may be made by those skilled in this art without departing from the scope of the invention.

The present disclosure relates to subject matter contained in Japanese Patent Application No. 2000-157900 (filed on May 29, 2000), which is expressly incorporated herein, by reference, in their entireties.

What is claimed is:

1. A cover plate for covering an opening of a casing in which a solid state imaging device is disposed, said cover plate comprising:
   a transparent cover plate member that hermetically covers said opening, said transparent cover plate member including a first surface facing the solid state imaging device and a second surface, opposite to the first surface, facing away from the solid state imaging device; and
   a conductive film layer that covers the second surface of said transparent cover plate member, said conductive film layer being the furthest layer from the solid state imaging device.

2. A cover plate according to claim 1, wherein said conductive film layer comprises a metallic film layer.

3. A cover plate according to claim 2, wherein said metallic film layer comprises a Cr film layer.

4. A cover plate according to claim 1, wherein said transparent cover plate member comprises a plurality of laminated transparent plates and at least one of said transparent plates comprises an optical low-pass filter.

5. A cover plate according to claim 4, wherein said optical low-pass filter comprises a plurality of lithium niobate plates.

6. A cover plate according to claim 1, wherein said transparent cover plate member comprises a plurality of laminated transparent plates and at least one of said transparent plates comprises an infrared cut-off filter.

7. A cover plate according to claim 6, wherein at least one of said transparent plates comprises an optical low-pass filter.

8. A cover plate according to claim 7, wherein said infrared cut-off filter and said optical low-pass filter are arranged so that said infrared cut-off filter is disposed at a side closer to said solid state imaging device.

9. A cover plate according to claim 1, wherein said transparent cover plate member comprises a plurality of laminated transparent plates and at least one of said transparent plates comprises a cover glass.

10. A cover plate according to claim 1, wherein said transparent cover plate member comprises at least one lithium niobate plate and said conductive film layer is formed on at least one side of said lithium niobate plate.

11. A cover plate according to claim 1, wherein said transparent cover plate member comprises at least one infrared cut-off filter and said conductive film layer is formed on at least one side of said infrared cut-off filter.

12. A cover plate according to claim 1, wherein said transparent cover plate member comprises at least one cover glass and said conductive film layer is formed on at least one side of said cover glass.

13. An image pickup device, comprising:
   a solid state imaging device;
   a casing in which said solid state imaging device is disposed;
   a transparent cover plate member that hermetically covers an opening of said casing, said transparent cover plate member including a first surface facing the solid state imaging device and a second surface, opposite to the first surface, facing away from the solid state imaging device; and
   a conductive film layer that covers the second surface of said transparent cover plate member, said conductive film layer being the furthest layer from the solid state imaging device.

* * * * *